(12) United States Patent
Kim et al.

(10) Patent No.: US 8,370,710 B2
(45) Date of Patent: Feb. 5, 2013

(54) NON-VOLATILE MEMORY DEVICES, SYSTEMS, AND DATA PROCESSING METHODS THEREOF

(75) Inventors: Yong June Kim, Seoul (KR); Jaehong Kim, Seoul (KR); Junjin Kong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 786 days.

(21) Appl. No.: 12/507,096

(22) Filed: Jul. 22, 2009

(65) Prior Publication Data

US 2010/0077279 A1    Mar. 25, 2010

(30) Foreign Application Priority Data

Sep. 19, 2008  (KR) ................ 10-2008-0092254

(51) Int. Cl.
*G11C 29/00* (2006.01)
(52) U.S. Cl. ...................... 714/763; 714/773
(58) Field of Classification Search .............. 714/763, 714/773
See application file for complete search history.

(56) References Cited

U.S. PATENT DOCUMENTS

| | | | |
|---|---|---|---|
| 6,240,538 B1 | 5/2001 | Dent et al. | |
| 2004/0022087 A1* | 2/2004 | Satori | 365/185.09 |
| 2004/0153729 A1* | 8/2004 | Yoshida | 714/6 |
| 2005/0289402 A1* | 12/2005 | Nerl et al. | 714/52 |
| 2006/0282717 A1* | 12/2006 | Suda | 714/712 |
| 2008/0225958 A1* | 9/2008 | Park et al. | 375/240.25 |
| 2008/0301524 A1* | 12/2008 | Horisaki et al. | 714/760 |

FOREIGN PATENT DOCUMENTS

| | | |
|---|---|---|
| KR | 10-2005-0116995 | 12/2005 |
| KR | 10-2009-0011230 | 2/2009 |
| KR | 100225032 B1 | 7/2009 |

* cited by examiner

*Primary Examiner* — M. Mujtaba K Chaudry
(74) *Attorney, Agent, or Firm* — Myers Bigel Sibley & Sajovec

(57) ABSTRACT

Provided are data processing methods for a non-volatile memory. The data processing methods include obtaining read data and erasure information from the non-volatile memory and correcting an error in the read data by referencing the erasure information obtained from the non-volatile memory. Memory systems may be provided. Such memory systems may include a non-volatile memory and a memory controller that is operable to perform an error correction operation according to the methods described herein.

14 Claims, 14 Drawing Sheets

$d_0 < d_1$

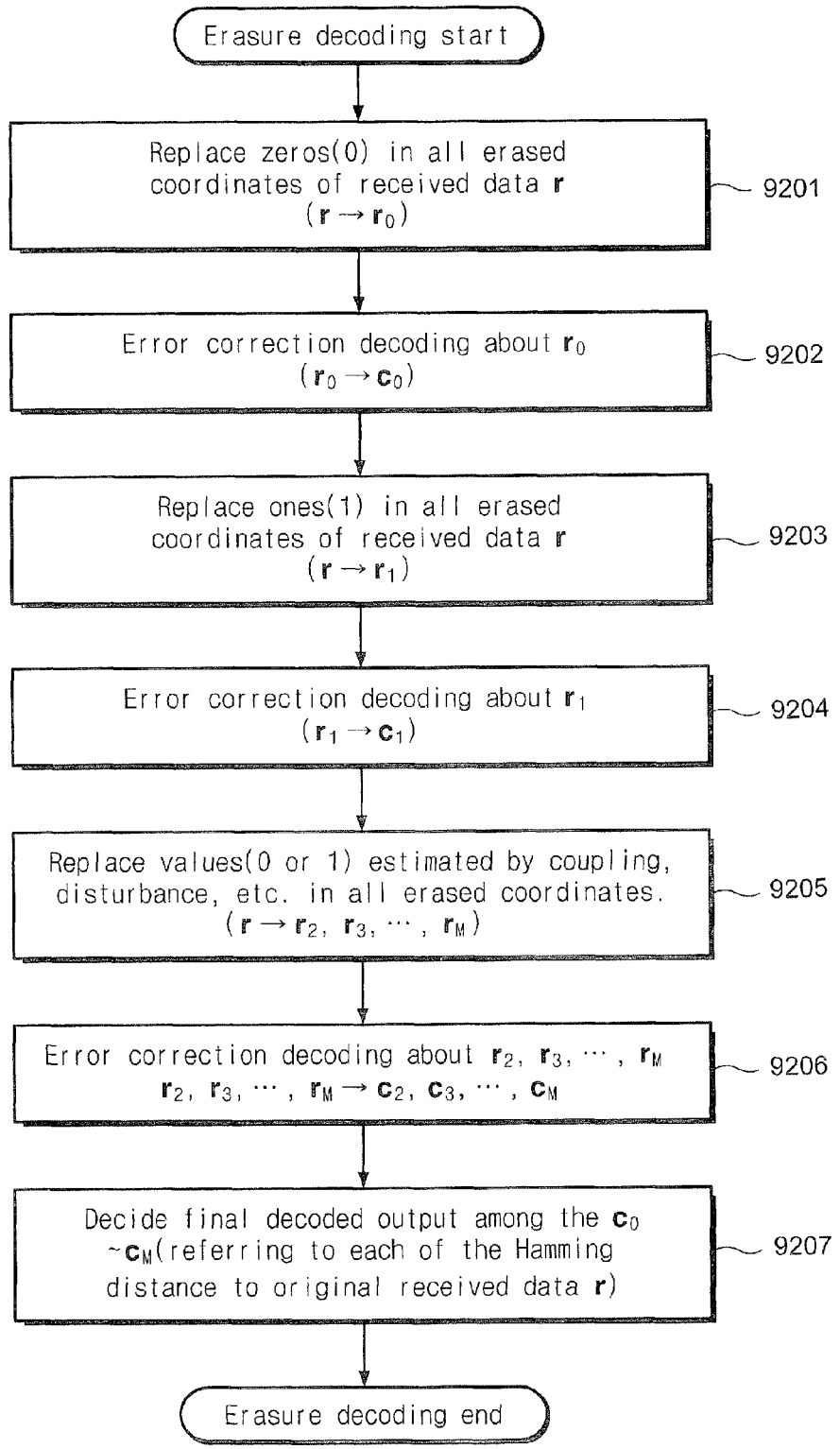

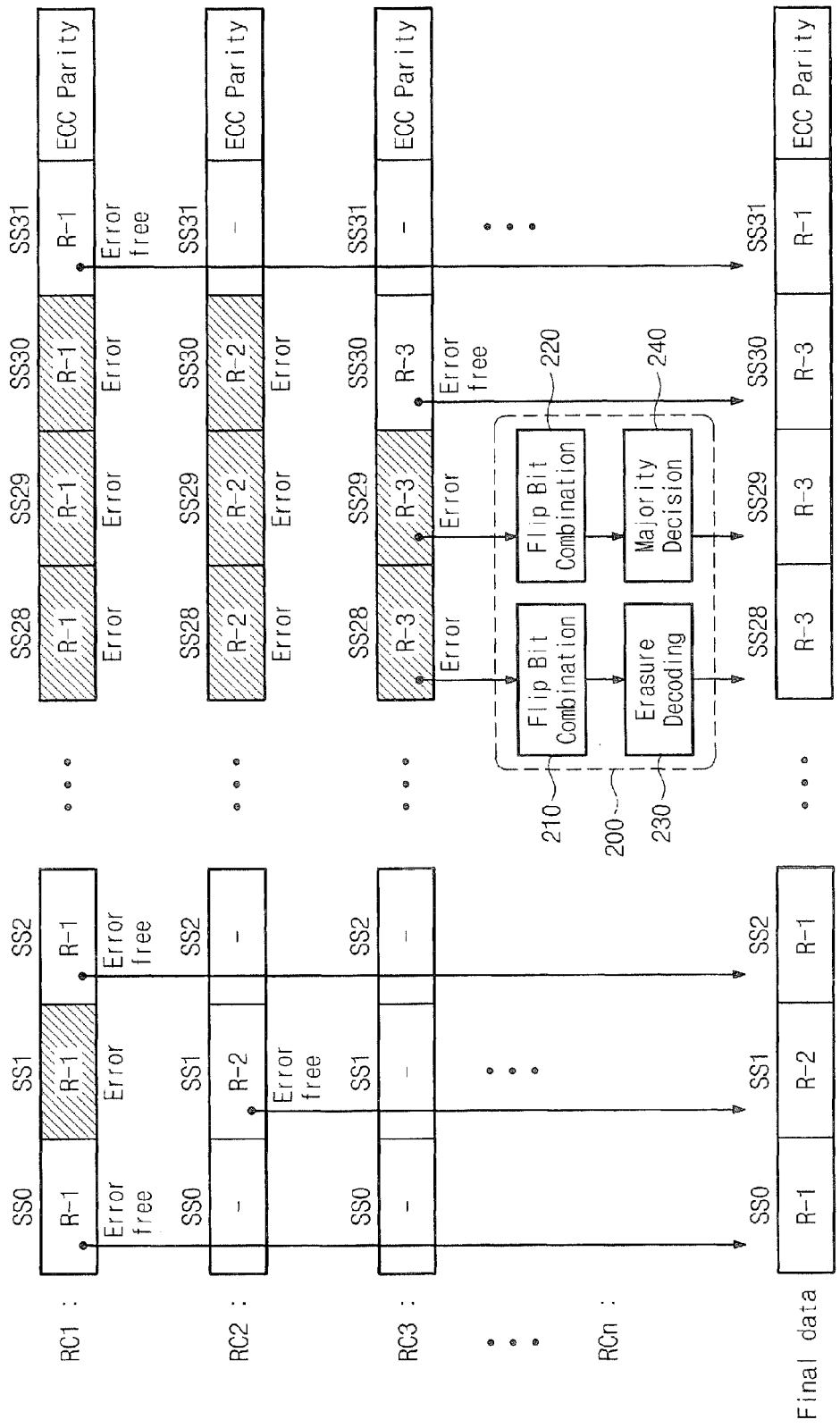

NON-VOLATILE MEMORY DEVICES, SYSTEMS, AND DATA PROCESSING METHODS THEREOF

CROSS-REFERENCE TO RELATED APPLICATIONS

This U.S. non-provisional patent application claims priority under 35 U.S.C. §119 of Korean Patent Application No. 10-2008-0092254, filed on Sep. 19, 2008, the entire contents of which are hereby incorporated by reference as if fully set forth herein.

BACKGROUND OF THE INVENTION

The present invention disclosed herein relates to an electronic device, and more particularly, to a memory system.

Semiconductor memory devices may be largely classified into volatile semiconductor devices and non-volatile semiconductor memory devices. The volatile semiconductor memory device may have an advantage in that read and write operations are performed at a high speed, but may have a disadvantage in that its stored contents disappear if there is no external power supply. In contrast, the non-volatile semiconductor memory device may retain its stored contents regardless of power supply applied thereto. The non-volatile semiconductor memory device may include a mask read-only memory (MROM), a programmable read-only memory (PROM), an erasable programmable read-only memory (EPROM), and an electrically erasable programmable read-only memory (EEPROM).

In general, it may be difficult for general users to update memory contents since a system itself may be restricted for performing erase and write operations on the MROM, PROM, and EPROM. In contrast, since the EEPROM is capable of performing erase and write operations electrically, it may realize increased applications of system programming (which requires continuous updating) and/or auxiliary memory devices. This may be especially true since a flash EEPROM may have a higher integration degree compared to a typical EEPROM. In this regard, the EEPROM may provide significant advantage regarding applications in high capacity auxiliary memory devices. A NAND-type flash EEPROM (hereinafter, referred to as a NAND flash memory) among flash EEPROMs may have a higher integration degree than other flash EEPROMs.

As a demand for the high integration degree of memory devices has increased, multi-bit memory devices storing a multi-bit in one memory cell is extensively used. Memory cells of the multi-bit memory device may be controlled with a dense interval between threshold voltage distributions. That is, data retention characteristic and the number of program/erase cycles (or durability) without quality deterioration may be an important concern as related to data reliability. However, a threshold voltage of a memory cell may change due to various factors. For example, electric charges (or, electrons) stored in a floating gate may leak through thermionic emission and charge diffusion (which are caused by a defective insulation layer and various fail mechanisms such as ion impurities and program disturb stress). This may cause a shift of a threshold voltage. If a floating gate stores charges gradually when a control gate is in a state where a predetermined voltage (for example, a power voltage or a read voltage) is maintained, charge acquisition effect may occur due to read disturb. This may increase a threshold voltage. Accordingly, threshold voltage distributions of memory cells may gradually broaden due to charge loss and charge acquisition. This threshold voltage range expansion may result in increased errors in read data. Therefore, error control techniques may be beneficial.

SUMMARY

The present invention provides data processing techniques for improving error correction ability and a memory system including the same. Some embodiments of the present invention provide data processing methods for a non-volatile memory include. Such methods may include obtaining read data and erasure information from the non-volatile memory and correcting an error in the read data by referencing the erasure information that is obtained from the non-volatile memory.

In some embodiments, the erasure information includes data corresponding to a declared erasure position in the read data. Some embodiments provide that correcting the error includes generating first decoding data by substituting logic 0 into all erased coordinates of the read data and then performing an error correction operation and generating second decoding data by substituting logic 1 into all erased coordinates of the read data and then performing an error correction operation.

Some embodiments include selecting one of the first decoding data and the second decoding data as final decoding data. In some embodiments, selecting one of the first decoding data and the second decoding data includes selecting the one of the first decoding data and the second decoding data having a shorter hamming distance with respect to the read data as the final decoding data. Some embodiments include generating a plurality of parameter data by substituting combination of logic 0 and logic 1 into each of the erased coordinates of the read data and generating a plurality of decoding data by performing an error correction operation on each of the plurality of parameter data. Some embodiments further include selecting one of the first decoding data, the second decoding data, and the plurality of decoding data as final decoding data.

In some embodiments, selecting one of the first decoding data, the second decoding data, and the plurality of decoding data as final decoding data includes selecting the one of the first decoding data, the second decoding data, and the plurality of decoding data having the shortest hamming distance with respect to the read data as the final decoding data.

Some embodiments provide that correcting the error includes generating and calculating an erasure locator polynomial $\Gamma(x)$ from the erasure information and the read data, generating and calculating a syndrome polynomial $S(x)$ by substituting 0 into all the erased coordinates of the read data with reference to a solution of the erasure locator polynomial $\Gamma(x)$, calculating a modified syndrome polynomial $\Xi(x)$ using the erasure locator polynomial $\Gamma(x)$ and the syndrome polynomial $S(x)$, generating an error locator polynomial $\Lambda(x)$ from the modified syndrome polynomial $\Xi(x)$ and calculating a solution of the error locator polynomial $\Lambda(x)$, and generating an error/erasure locator polynomial $\Psi(x)$ by multiplying the error locator polynomial $\Lambda(x)$ by the erasure locator polynomial $\Gamma(x)$ in order to calculate an error value and an erasure value.

In some embodiments, generating the error locator polynomial $\Lambda(x)$ comprises applying a Chien search algorithm to obtain a solution of the error locator polynomial $\Lambda(x)$. Some embodiments provide that obtaining the erasure information includes reading repeatedly a selected memory region of the non-volatile memory under respectively different read conditions and storing a position as the erasure information, the position having respectively different bit values at the same position among the repeatedly read data.

Some embodiments include designating the erasure information as a position where read bits have the same frequency at the same position. In some embodiments, obtaining the erasure information includes reading repeatedly between respectively different program states of the non-volatile memory through respectively different read voltages and designating a column address of memory cells that have a threshold voltage between the respectively different read voltages as the erasure information.

Some embodiments of the present invention include methods of reading a flash memory device that may include reading data from the flash memory device, performing a first error correction operation on the data, obtaining erasure information about the data if the first error correction operation is failed, and performing a second error correction operation to correct an error in the read data by referencing the erasure information. Some embodiments provide that during performing the second error correction operation, erasure decoding is performed to correct an error in the read data using the erasure information. In some embodiments, the erasure information includes an erasure position of the read data.

Some embodiments of the present invention include memory systems that include a non-volatile memory and a memory controller that is operable to perform an error correction operation. Some embodiments provide that the memory controller controls the non-volatile memory according to the data processing methods described herein.

Some embodiments of the present invention include data processing methods for a non-volatile memory. Such methods may include identifying an erasure location as a location of a multibit error in read data from the non-volatile memory, performing an erasure decoding operation on the erasure location in the non-volatile memory to determine erasure corrected data that is within an error correction operation capacity and performing an error correction operation on the erasure corrected data.

In some embodiments, performing an erasure decoding operation on the erasure location in the non-volatile memory to determine erasure corrected data that is within an error correction operation capacity includes generating first decoding data by substituting logic 0 into all erased coordinates of the read data and then performing an error correction operation and generating second decoding data by substituting logic 1 into all erased coordinates of the read data and then performing an error correction operation. Some embodiments include selecting one of the first decoding data and the second decoding data as final decoding data as the one of the first decoding data and the second decoding data having a shorter hamming distance with respect to the read data as the final decoding data.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention.

FIG. 9A is a flowchart illustrating some embodiments of the erasure decoding of FIG. 3.

FIG. 12 is a view illustrating a method of proving erasure position information using flip bit combination according to some embodiments of the present invention.

DETAILED DESCRIPTION

Figure 1:
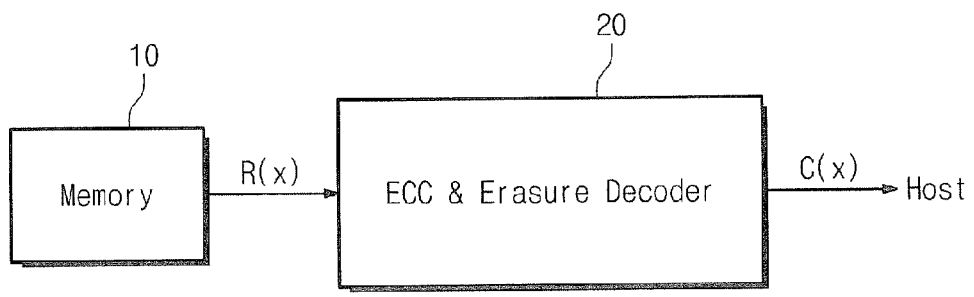
FIG. 1 is a block diagram illustrating a memory system according to some embodiments of the present invention.

It should be construed that foregoing general illustrations and following detailed descriptions are exemplified and an additional explanation of claimed inventions is provided.

Reference numerals are indicated in detail in preferred embodiments of the present invention, and their examples are represented in reference drawings. In every possible case, like reference numerals are used for referring to the same or similar elements in the description and drawings.

Below, a flash memory device as a semiconductor memory device is used as one example for illustrating characteristics and functions of the present invention. However, those skilled in the art can easily understand other advantages and performances of the present invention according to the descriptions. The present invention may be embodied or applied through other embodiments. Besides, the detailed description may be amended or modified according to viewpoints and applications, not being out of the scope, technical idea and other objects of the present invention.

An identifier (for example, r, $r_0$, $r_1$, c, $c_0$, $c_1$, and so forth) representing data or a code word used in the present invention may represent a vector expression. The term "erasure" may be used to indicate a state of a bit for which it is difficult to determine whether the bit is logic 0 or logic 1, rather than an indication that data is erased from a memory cell. In this regard, the term "erasure" may indicate a logic state that is not determinable as a logic 0 or a logic 1 during a data processing operation.

Reference is now made to FIG. 1, which is a block diagram illustrating a memory system for detecting and correcting an error of a read data R(x). The read data R(x) from a memory device 10 are delivered to an error correction code (ECC) & erasure decoder 20. The ECC & erasure decoder 20 may determine an error in the read data R(x) using an ECC. In some embodiments, the ECC & erasure decoder 20 may additionally perform erasure decoding using erasure information obtained from the memory device 10. If there is an error that cannot be corrected by hard decision decoding, erasure decoding for read data may be selectively performed. An error that cannot be corrected by the hard decision decoding can be corrected by erasure decoding. The data C(x) provided to a host are provided as data where an error is removed through the ECC and/or the erasure decoding.

Some embodiments provide that the memory device 10 may be provided using various memory devices. The memory device 10 may be provided as a volatile memory device or a non-volatile memory device. Examples of the non-volatile memory device may include a flash memory device, a phase change random access memory (PRAM) and/or a resistive memory such as a resistance random access memory (PRAM), among others. In addition, the non-volatile memory device 10 may be configured to include a memory device using one of memory devices such as a nano floating gate memory (MFGM), a polymer random access memory (Po-RAM), a magnetic random access memory (MRAM), and/or a ferroelectric random access memory (FRAM), among others. Additionally, the ECC & erasure decoder 20 may be provided as an algorithm and/or hardware placed in or out the memory device 10. In some embodiments, this configuration and/or function may be provided in a memory controller.

According to some embodiments of the ECC & erasure decoder 20 described herein, an error correction function that is more effective than that of the hard decision decoding may be provided.

Figure 2:
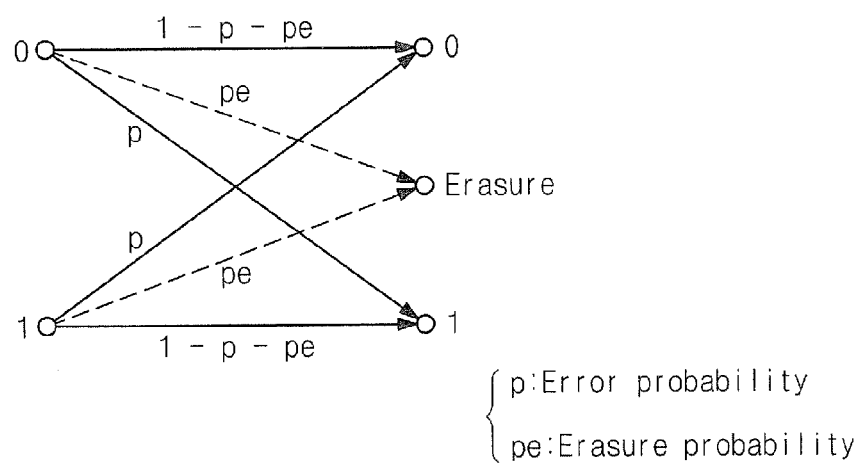
FIG. 2 is a channel model illustrating definition of erasure according to some embodiments of the present invention.

Reference is now made to FIG. 2, which is a view illustrating a channel model of a binary input-nonbinary output. In some embodiments, inputted data may be logic 1 or logic 0, but its outputted value is one of logic 1, logic 0, and erasure. Assuming that if an input is logic 0, an error probability (i.e., an output is logic 1) is p and probability (i.e., an output is erasure) is pe. Then, probability that an error or erasure is not outputted is 1-p-pe. In this channel model, an error and erasure may be defined based on whether there is information about error occurring positions. Some embodiments provide that the error means that the position where an error occurs cannot be found and the erasure means that only the position where an error occurs can be found.

Advantages that an error correction scheme using erasure will be described below by considering a hamming distance. If the minimum hamming distance of the received code word is $d_{min}$, it has an error correction ability ($t_{max}=[d_{min}-1/2]$, [x] represent the maximum natural number that does not exceed x) by a bounded distance decoder (BDD). Therefore, the number v of the correctable error bits may be expressed in Equation 1.

$$2v<d_{min}$$ [Equation 1]

If the erasure decoding is considered and the number of erasures is f, error correction ability may be expressed in Equation 2 as:

$$2v+f<d_{min}$$

$$v+f/2<t;$$ [Equation 2]

where t represents error correction ability.

Referring to Equation 2, if erasure information is obtained, more bit correction may be possible as compared to an error correction operation with no erasure information.

Figure 3:
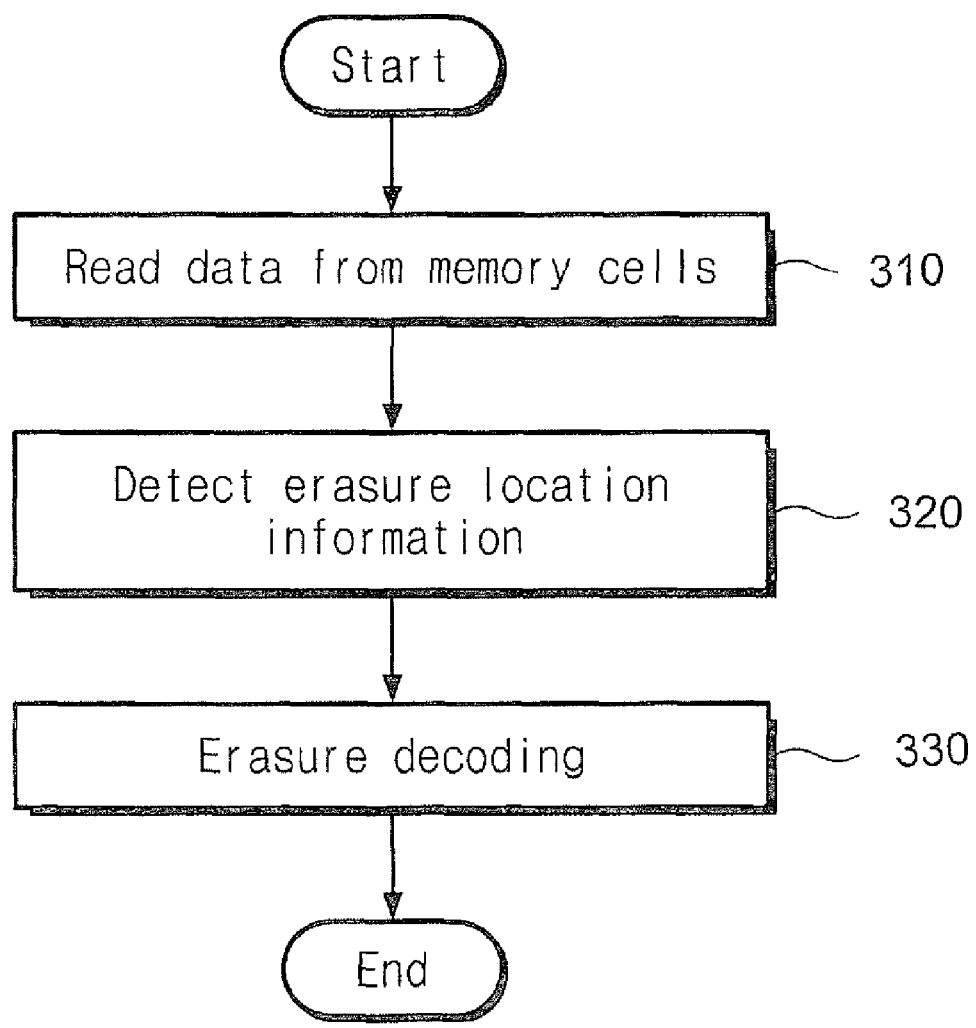
FIG. 3 is a flowchart illustrating some embodiments of the present invention.

Reference is now made to FIG. 3, which is a flowchart illustrating an error correction operation using erasure information according to some embodiments of the present invention. As illustrated, a data processing method may obtains the above discussed erasure information and then remove errors of read data from memory cells by referencing the acquired erasure information.

In some embodiments, first, a read operation is performed on data stored in a memory cell (block 310). Although a read unit may be diverse, read data may be outputted by a page unit and/or a sector unit in a NAND flash memory. Erase information may be detected and acquired from the read data (block 320). Some embodiments provide that the erasure information includes erasure location information about erasure occurrence in the read data. An interval read for obtaining an erasure position by reading a page at least two times (which is selected through read voltages shifting from typical read voltages) may be used for obtaining an erasure position. In some embodiments, a position of a column where flip bit combination occurs may be designated as an erasure position through a plurality of read operations having different read conditions (for example, a read voltage). Some embodiments provide that a column where majority decision is difficult in a flip bit combination may be designated as an erasure position. Further, in some embodiments, an erasure position can be determined by obtaining cell characteristics such as on coupling, program disturb, read disturb, and/or charge loss, among others. Methods for determining these erasure positions will be described in more detail with reference to the following drawings. After the erasure position is obtained, errors and erasure are corrected in the read data through erasure decoding (block 330). As a result, if the erasure position is obtained, error correction is possible for more than the number of error bits that may otherwise be correctable through a typical ECC engine.

Figure 4:
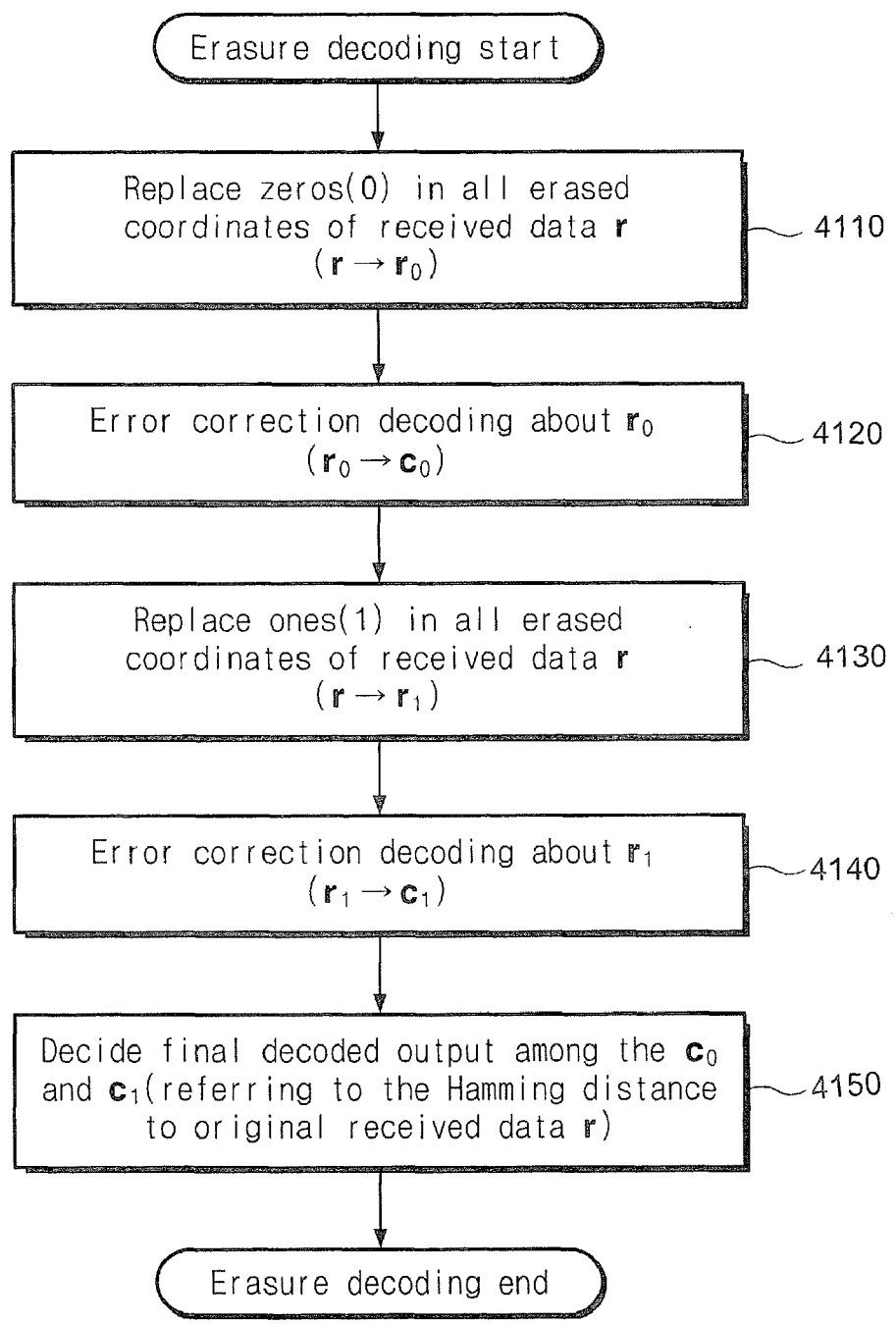
FIG. 4 is a flowchart illustrating some embodiments of erasure decoding according to FIG. 3.

Reference is now made to FIG. 4, which is a flowchart illustrating some embodiments of erasure decoding that corresponds to the operation 330 of FIG. 3. According to the erasure decoding of FIG. 4, logic 0 is substituted into the obtained erasure position to perform a general error correction operation such that one code word $c_0$ is generated. A logic 1 is substituted into the obtained erasure position to perform an error correction operation such that another code word $c_1$ is generated. A code word having an original read data r and a shorter hamming distance is selected as a final data from the generated code words. It is assumed that error and erasure in the read data are v and f, respectively. A more detailed description will be provided below.

Some embodiments provide that a logic 0 is substituted into erased coordinates of the read data received using the obtained erasure position. A code word where the erased coordinates of the read data r is replaced with logic 0 and is called read data $r_0$. The entire error number in the read data $r_0$ may be expressed as $v+v_0$ ($v_0$ is an error occurrence as logic 0 is substituted into erased coordinates) in operation 4110.

Next, an error correction operation is performed on the read data $r_0$. The error correction operation may include a general error correction decoding having an error correction ability of the above Equation 1. The read data $r_0$ may be outputted as a code word $c_0$ through the error correction decoding in operation 4120. Then, logic 1 is substituted into an erased coordinate of the read data received using the obtained erasure position. A code word where the erased coordinate of the read data r is replaced with the logic 1 is called read data $r_1$ (block 4130). In this regard, the entire error number in the read data $r_1$ may be $v+v_1$ ($v_1$ is an error occurrence as logic 1 is substituted into erased coordinates). An error correction operation is performed on the read data $r_1$. The read data $r_1$ are outputted as a code word $c_1$ through an error correction operation (block 4140). Lastly, one having the shortest hamming distance to the original received read data r is determined as the final decoding output from the decoded code words $c_0$ and $c_1$ (block 4150). Once the final decoding output is determined, general erasure decoding is completed. In this regard, the sum of an error bit number $v_0$ (which occurs as an erased coordinate is replaced with logic 0) and an error bit number $v_1$ (which occurs as an erased coordinate is replaced with logic 1) is identical to an entire erasure number. One of the error bit number $v_0$ and the error bit number $v_1$ may be less than or identical to f/2. Accordingly, error bits in one of the read data $r_0$ and the read data $r_1$ should be correctable through the error correction operation. Since the erasure position is designated through those characteristics, errors can be corrected more than the bit number that can be correctable through a typical ECC.

Figure 5:
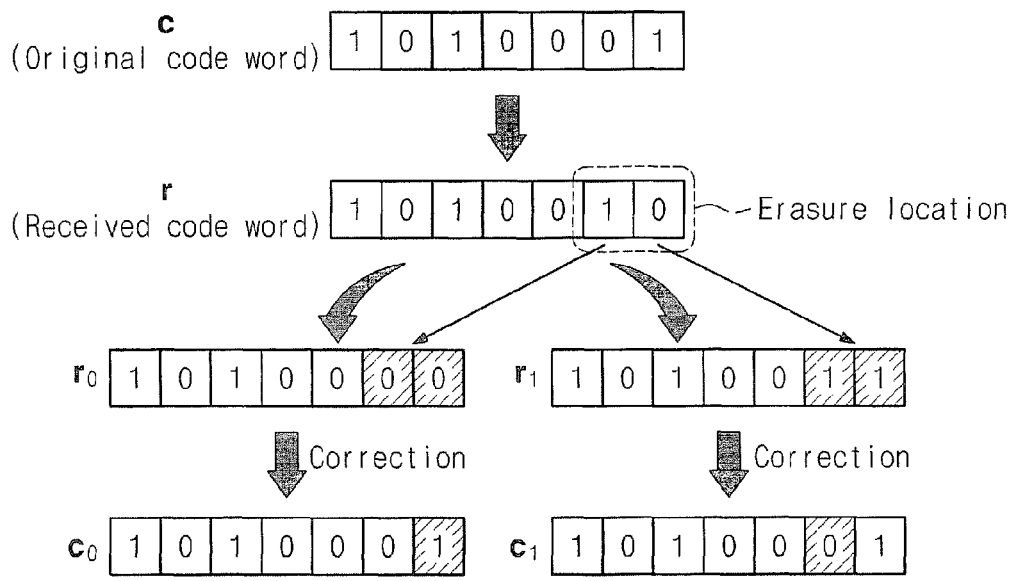
FIG. 5 is a view illustrating an example of erasure decoding in a bit level according to some embodiments of the present invention.

Reference is now made to FIG. 5, which is a view illustrating an actual example of the erasure decoding described regarding FIG. 4. This example provides that an original code word c stored in a memory cell is [1010001] in a (7, 4) hamming code where an error correction ability t is 1 and the minimum distance $d_{min}$ is 3. Moreover, the example provides that the received code word r is [1010010]. A 2-bit error exists in the received code word r. The maximum error bit number that can be correctable in the error correction operation without erasure decoding is 1-bit. However, since an error of 2 bits is included in the received code word r, it is impossible to correct the error using an error correction operation.

On the contrary, if erasure decoding is used, as described with reference to the above Equation 2, a greater quantity of errors can be corrected as compared to an error correction. In the present example, an erasure location is obtained with reference to the erasure information. As shown in the drawings, if the obtained erasure position is the last 2 bits of a message coordinate (that is, r=[10100XX]), the received code word $r_0$ is designated as [1010000] where logic 0 is substituted into an erased coordinate. The received code word $r_0$ includes only 1-bit error compared to an original code word c, and thus is included within an error correction ability t. Once an error correction operation is performed on the received code word $r_0$, decoded code word ($c_0$=[1010001]) is outputted. By referencing an erasure position (that is, r=[10100XX]), a received code word $r_1$ is designated as [1010011] where logic 1 is substituted into an erased coordinate. The received code word $r_1$ includes only 1-bit error compared to an original code word c, and thus is included within an error correction ability t. Once an error correction operation is performed on the received code word $r_1$, decoded code word ($c_1$=[1010001]) may be outputted. The code words $c_0$ and $c_1$ may be successfully decoded and have the same bit value. Accordingly, even if one of them is selected, it is outputted as [1010001], i.e., the original code word c. However, if all the decoding is successful, the outputted decoding code words $c_0$ and $c_1$ may have different values in some cases. In this case, more accurate output value can be obtained by selecting one having the shorter hamming distance with respect to the received code word r.

Figure 6:
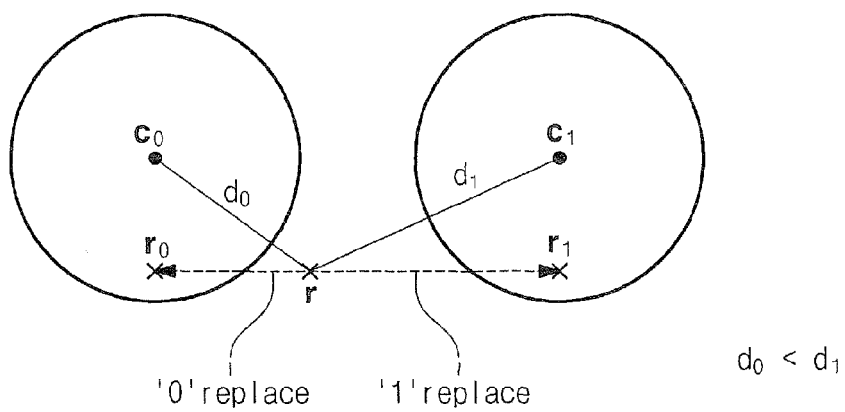
FIG. 6 is a view illustrating the example of FIG. 5 using a hamming distance.

Reference is now made to FIG. 6, which is a view illustrating a relationship between decoding code words $c_0$ and $c_1$ (which are outputted according to an error correction method using erasure decoding) and a received code word r with reference to a hamming distance according to some embodiments of the present invention. As illustrated, the received code word r has a vector value where an error cannot be correctable without applying an erasure decoding technique. Accordingly, when an erasure position is obtained, at least one of received code words $r_0$ and $r_1$ can be restored to an original code word through an error correction operation when all erased coordinates of the received code word r are replaced with logic 0 or logic 1, as described above regarding Equation 2.

Referring to the drawing again, if logic 0 is substituted into all erased coordinates, the received code word r moves to a vector value of the received code word $r_0$. The vector value of the received code word $r_0$ is included within a hamming distance where the vector value can be correctable through the decoding code word $c_0$. Accordingly, if an error correction operation is performed on the received code word $r_0$, it will be outputted as the decoding code word $c_0$. Additionally, if logic 1 is substituted into all erased coordinates, the received code word r moves to a vector value of the received code word $r_1$. The vector value of the received code word $r_1$ is included within a hamming distance where the vector value can be correctable through the decoding code word $c_1$. Accordingly, if an error correction operation is performed on the received code word $r_1$, it will be outputted as the decoding code word $c_1$. As shown, all the received code words $r_0$ and $r_1$, which result from the respective substitutions of logic 0 and logic 1 in erased coordinates may be possible in an error correction operation. In this regard, one having a shorter hamming distance with respect to a received code word r among the outputted decoding code words $c_0$ and $c_1$ may be selected. In the illustrated example, the decoded code word $c_0$ having the received code word $r_0$ and the hamming distance $d_0$ may be selected.

Figure 7:
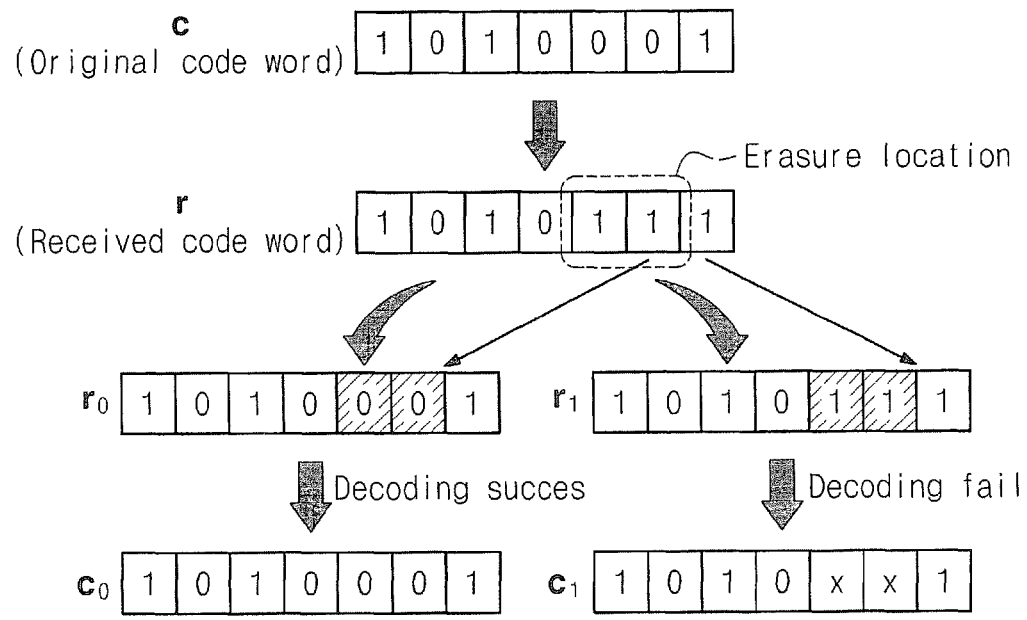
FIG. 7 is a view illustrating another example of erasure decoding in a bit level according to some embodiments of the present invention.

Reference is now made to FIG. 7, which is a view illustrating some embodiments of the erasure decoding described above regarding FIG. 4. By way of example, an original code word c stored in a memory cell is [101000] in a (7, 4) hamming code where an error correction ability t is 1 and the minimum distance $d_{min}$ is 3. In the present example, a 2-bit error exists in the received code word r and the number of the maximum error bits correctable in an error correction operation without using erasure decoding is one. In the present example, since an error of 2 bits is included in the received code word r, error correction is not possible using an error correction operation.

According to the example, an erasure location obtained by referencing erasure information is two coordinates located at the middle of the 4-bit message coordinate in the received code word r. As illustrated in FIG. 7, if an erasure location is 2-bits located at the middle of the message coordinate (i.e., r=[1010XX1], the received code word $r_0$ where logic 0 is substituted into the erased coordinate may be designated as [1010001]. Since the received code word $r_0$ has the same bit value as the original code word c, it substantially does not contain an error. If an error correction operation is performed on the received code word $r_0$, a decoded code word (i.e., $c_0$=[1010001]) will be outputted. The received code word $r_1$ where logic 1 is substituted into an erased coordinate by referencing an erase position (i.e., r=[1010XX1] may be designated as [1010111]. Since the received code word $r_1$ has a 2-bit error compared to an original code word c, it is out of the error correction ability t. If an error correction operation is performed on the received code word $r_1$, a decoding failure occurs. Accordingly, the code word $c_0$, which is successfully decoded and restored to the original code word c will be outputted.

Figure 8:
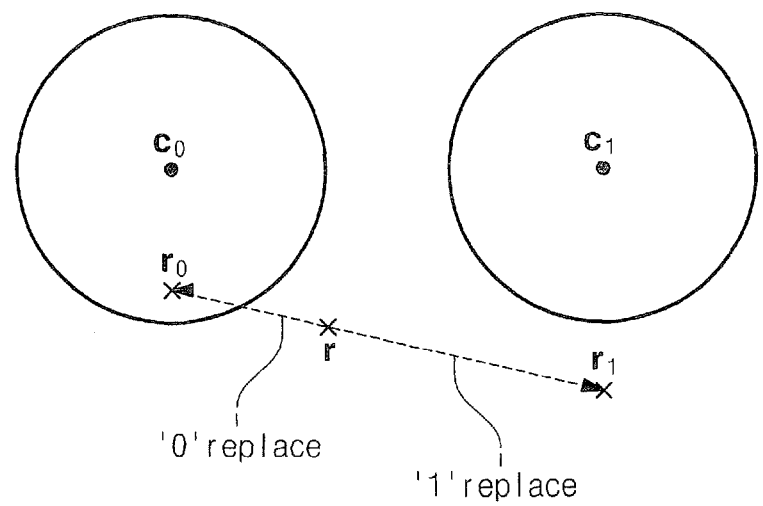
FIG. 8 is a view illustrating an example of FIG. 7 using a hamming distance.

Reference is now made to FIG. 8, which is a view illustrating a relationship between decoding code words $c_0$ and $c_1$ (which are outputted according to an error correction method using erasure decoding) and a received code word r with reference to a hamming distance according to some embodiments of the present invention. As illustrated and described below, at least one of received code words $r_0$ and $r_1$ can be restored to an original code word through an error correction operation when all erased coordinates of the received code word r are replaced with logic 0 or logic 1. If all the erased coordinates are replaced with logic 0, the received code word r moves to a vector value of the received code word $r_0$. The vector value of the received code word $r_o$ is included within a hamming distance where the vector value is correctable through the decoded code word $c_0$. Accordingly, if an error correction operation is performed on the received code word $r_0$, it will be outputted as the decoding code word $c_0$. Additionally, if logic 1 is substituted into all erased coordinates, the received code word r moves to a vector value of the received code word $r_1$. However, the vector value of the received code word $r_1$ is not located within a hamming distance where the vector value is correctable through the decoded code word $c_1$. The error correction operation for the received code word $r_1$ will be determined as a decoding failure. However, as the vector value of the received code word $r_0$ is already decoded into the decoded code word $c_0$ successfully, error correction is possible. In this regard, the decoded code word $c_0$ will be selected as an output.

Reference is now made to FIG. 9A, which is a flowchart illustrating some embodiments of the erasure decoding described in operation 330 of FIG. 3. In the embodiments of the erasure decoding in FIG. 4, all the erased coordinates of the received code word r are replaced with logic 0 or logic 1 in order to perform an error correction operation. Referring to FIG. 9A, embodiments where logic 0 and logic 1 are complexly substituted into the erased coordinates of the received code word r by referencing the erasure information will be described. In this regard, erasure decoding may be performed by referencing one or more erasure occurrence trends.

Logic 0 is substituted into erased coordinates of the read data r received using obtained erasure positions. In operation 9201, a code word where the erased coordinates of the read data r are replaced with logic 0 is called read data $r_0$. Next, an error correction operation is performed on the read data $r_0$ (block 9202). The read data $r_0$ is outputted as a decoded code word $c_0$ through error correction decoding. Then, logic 1 is substituted into erased coordinates of the received read data r (block 9203). A code word where erased coordinates of the read data r are replaced with logic 1 is called read data $r_1$. An error correction operation is performed on the read data $r_1$ (block 9204). The read data $r_1$ are outputted as the decoded code word $c_1$ through error correction decoding. Then, by referencing the obtained erasure information or erasure position, the erased coordinates of the received read data r are replaced with various combinations of logic 1 and logic 0 (block 9205). The combination of logic values, which are substituted into the erased coordinates, may be determined by considering a threshold voltage shift of a memory cell such as coupling, program disturb, read disturb, and/or charge loss, among others. The reason is that an error occurrence pattern of a memory cell may have a predetermined tendency according to a trend of a threshold voltage shift of a memory cell. It may be outputted as received read data (e.g., $r_2, r_3, \ldots, r_M$, $2' < M < 2^f$). An error correction operation is performed on each read data $r_1$ (block 9206). The read data (e.g., $r_2, r_3, \ldots, r_M$, $2 \leq M < 2^f$) may be outputted as the decoded code words (e.g., $c_2, \ldots, c_M$, $2 \leq M < 2^f$) through error correction decoding. Lastly, the decoded word having the shortest hamming distance with respect to the original received read data r among the decoded code words (e.g., $c_0, c_1, \ldots, c_M$, $2 \leq M < 2^f$) is determined as the final decoding output (block 9207). Once the last outputted decoded data are determined, general erasure decoding is completed.

Figure 9B:
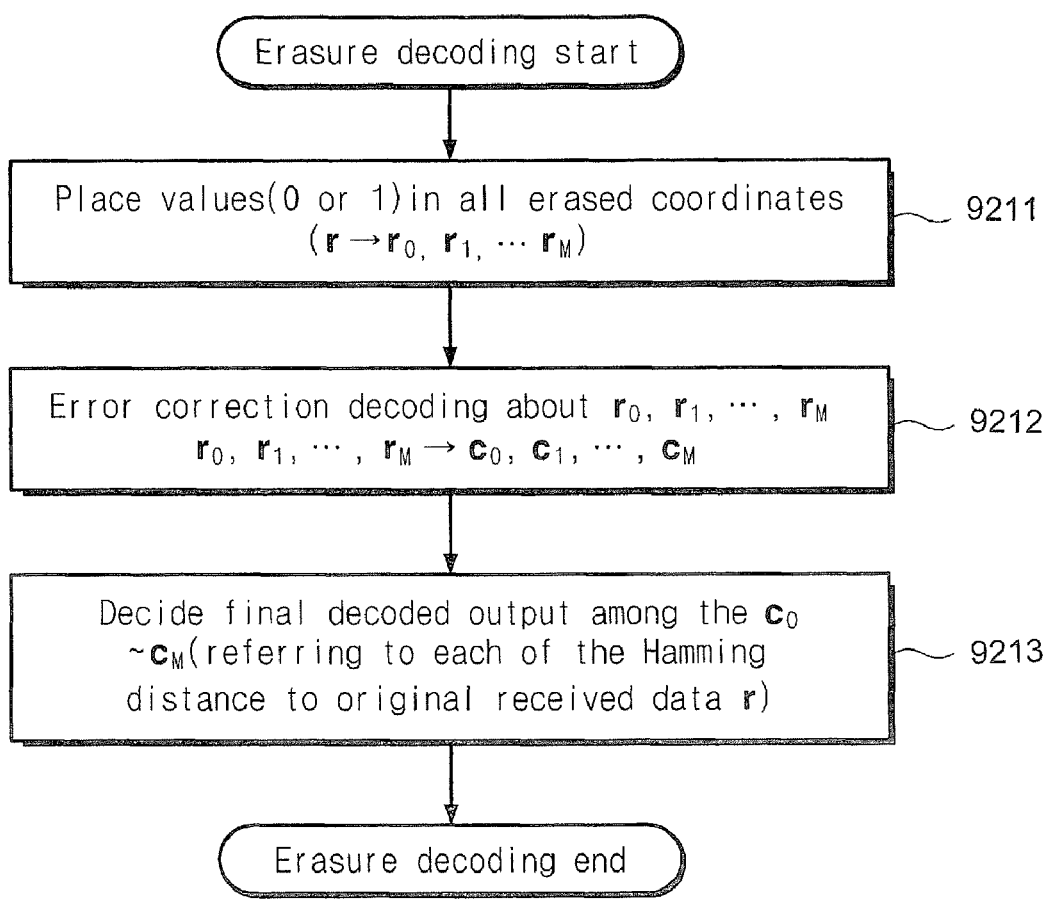
FIG. 9B is a flowchart illustrating some further embodiments of the erasure decoding of FIG. 3.

Reference is now made to FIG. 9B, which is a flowchart illustrating some embodiments of erasure decoding. As discussed above, the embodiments of FIG. 9A include operations 9201 to 9204 where logic 0 or logic 1 is compulsorily substituted into all erased coordinates of the received code word r to perform error correction operations. However, these procedures increases time consumed in the decoding operations. Additionally, even if at least one bit or more bits among all erased coordinates of the received code word r has other bit values, the decoding result may not be affected. In this regard, the illustration of FIG. 9B omit operations where logic 0 or logic 1 is compulsorily substituted into all erased coordinates of the received code word r to perform error correction operations.

As illustrated in FIG. 9A, a logic 0 is substituted into the erased coordinates of the received read data r using an obtained erasure position (block 9201). A code word where the erased coordinates of the read data r are replaced with logic 0 is called read data $r_0$. Next, an error correction operation is performed on the read data $r_0$ (block 9202). The read data $r_0$ are outputted as decoded code word $c_0$ through error correction decoding. Then, logic 1 is substituted into the erased coordinates of the received read data r using an obtained erasure position. A code word where the erased coordinates of the read data r are replaced with logic 1 is called read data $r_1$ in operation 9203. An error correction operation is performed on the read data $r_1$. The read data $r_1$ are outputted as decoded code word $c_1$ through error correction decoding in operation 9204.

Referring to FIG. 9B, various combinations of logic 1 and logic 0 are substituted into the erased coordinates of the received read data r (block 9211). The combination of the logic values, which are substituted into the erased coordinates, are determined by considering a threshold voltage shift of a memory cell such as coupling, program disturb, read disturb, and/or charge loss among others. The reason is that an error occurrence pattern of a memory cell may have a predetermined tendency according to a trend of a threshold voltage shift of a memory cell. The combination of the logic values, which are substituted into the erased coordinates, may be determined without considering the above-mentioned threshold voltage shift. Once the combination of various logic values are substituted, the received read data r will be outputted as the read data (e.g., $r_0, r_1, \ldots, r_M$, $2 \leq M < 2^f$). An error correction operation will be performed on the read data (e.g., $r_0, r_1, \ldots, r_M$, $2 \leq M < 2^f$) (block 9212). The read data (e.g., $r_0, r_1, \ldots, r_M$, $2 \leq M < 2^f$) are outputted as decoded code words (e.g., $c_0, \ldots, c_M$, $2 \leq M < 2^f$). Lastly, one having the shortest hamming distance with respect to the original received read data r among the decoded code words (e.g., $c_0, c_1, \ldots, c_M$, $2 \leq M < 2^f$) is determined as the final decoding output (block 9213). Once the last outputted decoded data are determined, general erasure decoding is completed.

According to some embodiments of the above-mentioned erasure decoding, more decoded code words (e.g., $c_0, \ldots, c_M$, $2 \leq M < 2^f$) can be provided by referencing the trend of an erasure pattern occurring in the flash memory cell. Accordingly, more accurate output can be accomplished as compared to the methods described regarding FIG. 4.

Figure 10:
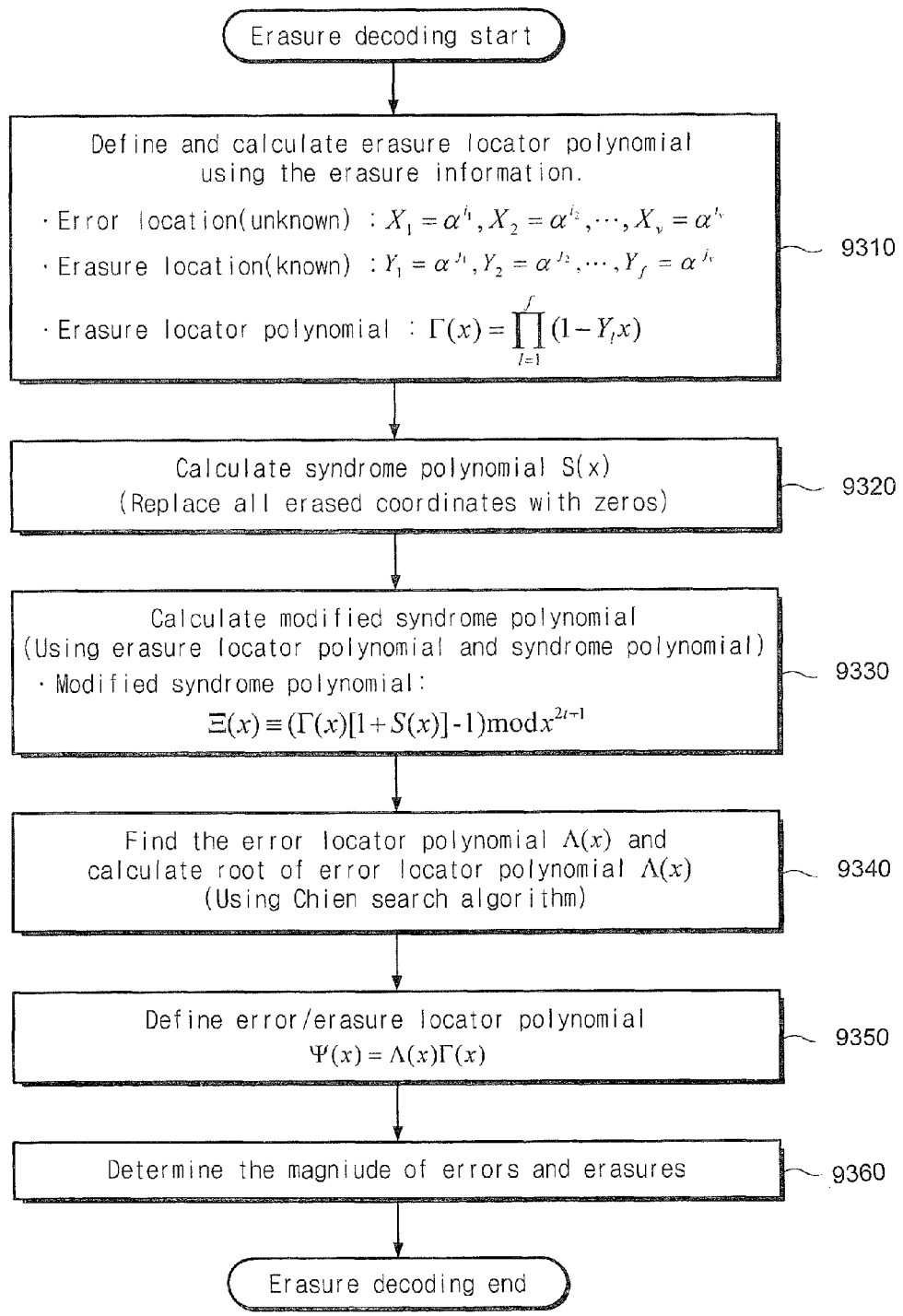
FIG. 10 is a flowchart illustrating an erasure decoding method according to some embodiments of the present invention in a nonbinary error correction code.

Reference is now made to FIG. 10, which is a flowchart illustrating some embodiments applying erasure decoding to a nonbinary ECC. Referring to FIG. 10, logic 0 is substituted into erased coordinates of the received code word r by referencing erasure information to obtain solutions of a polynomial and/or a syndrome polynomial. Then, solutions of an error locator polynomial may be obtained using the obtained syndrome elements. An error value and erasure value can be obtained using the solution of the error locator polynomial. This will be described in more detail as follows.

An erasure position is designated by referencing erasure information obtained from a memory, and an erasure locator polynomial is defined (block 9310). By way of example, the read data or the received code word r has the v number of errors and the f number of erasures. Here, the position of errors may be assumed with a vector expression of $X_1, X_2, \ldots, X_v$. Additionally, the erasure position obtained through erasure information from a memory is expressed with $Y_1, Y_2, \ldots, Y_f$. The erasure locator polynomial $\Gamma(x)$ defined based on the above information is expressed in Equation 3 below.

$$\Gamma(x) = \prod_{i=1}^{f} (1 - Y_i x) \quad \text{[Equation 3]}$$

Referring to the erasure information, the erasure locator polynomial $\Gamma(x)$, which is defined in Equation 3, is calculated in operation 9310. Next, 0 is substituted into all the erased coordinates of the received code word r to calculate syndrome polynomial S(x) (block 9320). Then, each syndrome coefficient is obtained by calculating the modified syndrome polynomial. The erasure locator polynomial $\Gamma(x)$ and the syndrome polynomial S(x) are used to calculate the modified syndrome polynomial $(\Xi(x) = (\Gamma(x)[1+S(x)]-1) \bmod x^{2t+1})$ in operation 9330. Solutions of the modified syndrome polynomial, that is, the syndrome coefficients ($\Xi_i$, i=f+1, f+2, ..., 2t), can be used to find an error locator polynomial $\Lambda(x)$. Once the error locator polynomial $\Lambda(x)$ is determined, the solution of the error locator polynomial $\Lambda(x)$ is obtained using a method such as, for example, a Chien search algorithm, in operation 9340. Since the erasure position and error position are determined, error/position polynomial $\Psi(x) = \Lambda(x)\Gamma(x)$ may be defined first to obtain an erasure value and an error value in operation 9350. The error and erasure values may be determined through the error/erasure locator polynomial in operation 9360. Once the error and erasure values are determined, erasure decoding necessary for the nonbinary ECC is completed.

Figure 11A:
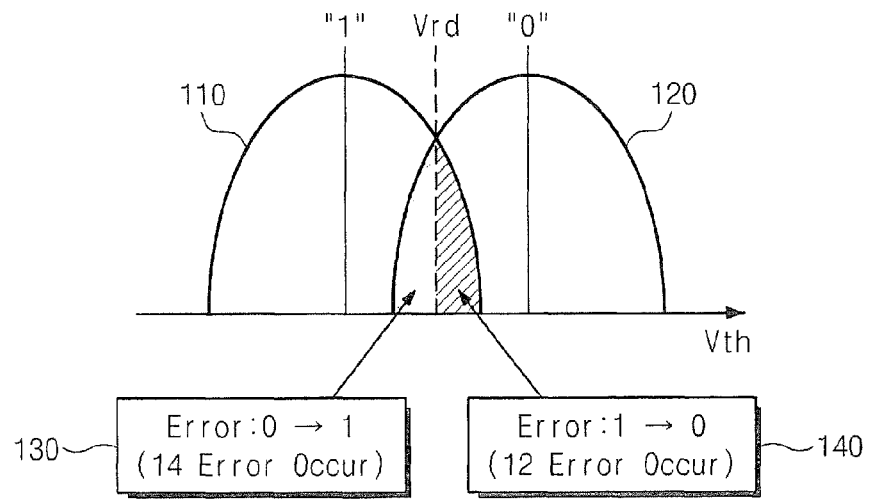
FIG. 11A is a view illustrating error occurrence of a non-volatile memory according to some embodiments of the present invention.
Figure 11B:
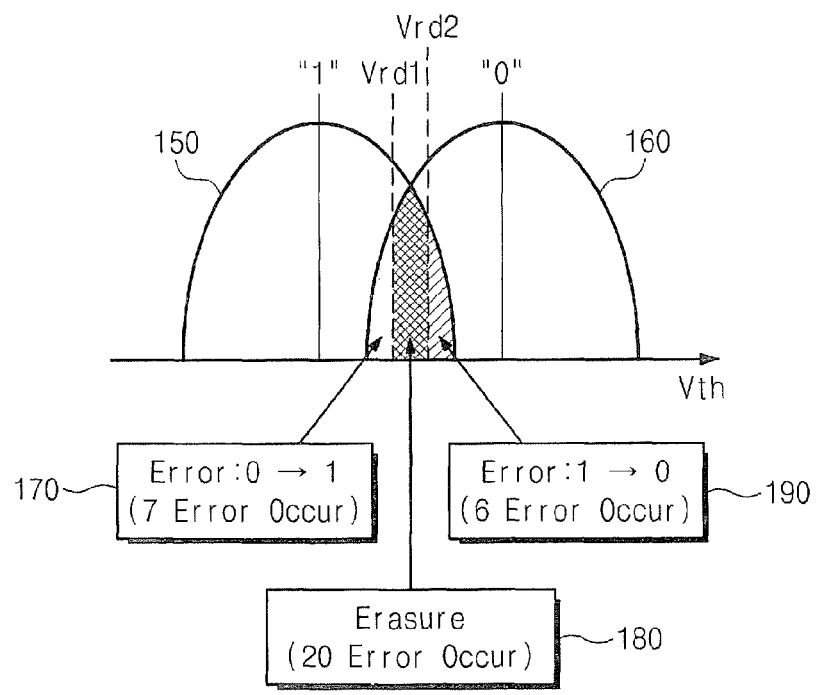
FIG. 11B is a view illustrating a method of obtaining erasure information from a non-volatile memory according to some embodiments of the present invention.

Reference is now made to FIGS. 11A and 11B, which are views illustrating a method of obtaining the above-mentioned erasure information, according to some embodiments of the present invention. FIG. 11A illustrates some embodiments of a data reading method for an error correction operation to which erasure decoding is not applied. Additionally, FIG. 11B illustrates some embodiments of a data reading method for an error correction operation to which erasure decoding is applied. That is, FIG. 11A illustrates a case of sensing data of a flash memory cell using a typical reading method and FIG. 11B illustrates an interval read for a flash memory cell to obtain erasure position information. For convenience of description, an error correction operation applying Bose-Chadhuri-Hocquenghem (BCH) code (where an error correction ability t is 24 and the minimum hamming distance $d_{min}$ is 49) is used as an example for description.

Referring to FIG. 11A, a threshold voltage of a memory cell is spread according to time elapse or repetition of program/erase cycle (or, P/E cycle). That is, a read margin is reduced from an initially-programmed state because of influences such as charge loss, program disturb, read disturb, and/or coupling in a threshold voltage, among others, of a memory cell. FIG. 11A illustrates a state where an error is inevitable even if a memory cell is sensed with a read voltage because threshold voltage distribution of a memory cell is diffused. According to the shift of a threshold voltage, the threshold voltage distribution 110 and the threshold voltage distribution 120 overlap. That is, although programmed with logic 0 initially, when sensed by the read voltage Vrd, there may be error cells 130 read as logic 1. Additionally, although programmed with logic 1 initially, when sensed by the read voltage Vrd, there may be error cells 140 read as logic 0. The number of entire error bits (where the number of error cells 130 is 14 and the number of error cells 140 is 12) becomes 26. In this case, when the number of error bits is 26, the error correction ability (that is, 24) may be exceeded. Accordingly, error correction becomes impossible, and even if performed, a decoding failure occurs.

On the contrary, referring to FIG. 11B for applying erasure decoding, as described with Equation 2, error correction is possible for a quantity of error bits that exceeds the error correction ability. The erasure information (e.g., the erasure position) needs to be provided for erasure decoding. FIG. 11B illustrates an interval read for selecting and declaring memory cells positioned between read voltages Vrd1 and Vrd2. All mutually overlapping areas between the threshold voltage distribution 150 and the threshold voltage distribution 160 are not regarded as errors, but instead may be declared as an erasure. As illustrated in the drawing, among memory cells corresponding to the overlapping areas, the memory cells 170 having a lower threshold voltage than a read voltage Vrd1 and the memory cells 190 having a higher threshold voltage than a read voltage Vrd2 are declared as errors. Additionally, among memory cells corresponding to the overlapping areas, memory cells 180 where a threshold voltage between a read voltage Vrd1 and a read voltage Vrd2 is distributed are declared as erasures. Bits corresponding to memory cells declared as erasures through interval read may have their position values in a page or a sector. Through the interval read, the number of error bits is 13 (7+6), and the number of erasure bits obtaining positions is 20. Referring to Equation 2 and the number of erasure bits and the number of error bits, (2*v+f)=(2*13+20)=46 and is less than the minimum hamming distance $d_{min}$ (that is, 49). Accordingly, it may be understood that error correction may be possible if erasure decoding is applied. In this regard, a latch structure of a page buffer should be provided in order to distinguish the memory cells 180 (declared as erasures in the overlapping area of the threshold voltage distributions 150 and 160) from a majority of other memory cells (having correct data).

Reference is now made to FIG. 12, which is view illustrating a reading method of a memory system according some embodiments of the present invention. The read data from a memory device 10 as discussed above regarding FIG. 1 are delivered to the ECC & erasure decoder 20 in response to a read request. However, if errors occur in a read page with the size that the typical ECC engine cannot correct, the same page is re-read by changing a read condition RC. A page, which is read under a first read condition RC1, includes a plurality of sub-sectors SS0 to SS31 and ECC parity. The read page includes a plurality of sub-sectors SS0 to SS31 having error correction and detection ability through ECC such as a BCH code and/or a cyclic redundancy check (CRC) code. Accordingly, the sub-sectors SS0, SS2, and SS31 without errors may be temporarily stored in a buffer memory (not shown). However, in order to read sub-sectors having errors, a page selected under a second read condition RC2 is re-read. Only the sub-sector SS1 in the page read under a second read condition RC2 is selectively stored in the buffer memory. However, the sub-sectors SS0, SS2, and SS3, which are already stored in the buffer memory because there is no error, are not considered. The sub-sectors having no error are stored in the buffer memory by changing these read conditions to repeatedly perform a re-read operation. Even if data are read under a plurality of read conditions, there are sub-sectors SS28 and SS29 having errors. One of methods for correcting errors of the sub-sectors uses flip bit combination. Bits of a column where there is a bit toggled under each read conditions will be called a flip bit combination. The flip bit combinations of the sub-sectors SS28 and SS29 are referred to herein as flip bit combination 210 and flip bit combination 220. One of methods for determining data using the flip bit combination may use a method for determining a bit of high occurrence frequency as an output. A method of determining bits exceeding the half of logic 1 or logic 0 in the flip bit combination as an output or bits exceeding a predetermined ratio in an entire flip bit combination as an output is called a majority decision. According to the majority decision 240 for the flip bit combination 220, an output for the flip bit combination 220 may be determined, and thus, the sub-sector SS29 is stored in the buffer memory. However, the majority decision may not be applied to the flip bit combination having the like or same occurrence frequency. For this flip bit combination 210, the above-mentioned erasure decoding may be applied. The sub-sector SS29 may be error-correctable through the erasure decoding 230 that performs an error correction operation by substituting logic 1 or logic 0 into all the flip bit combinations. Accordingly, the sub-sector SS28 is outputted as decoding success by the erasure decoding 230 for the flip bit combination 210 having the like or same occurrence frequency of logic 0 and logic 1, and then is stored in the buffer memory. Then, after the sub-sectors having no error stored in the buffer memory are gathered, they may constitute one page (i.e., final data) and then output them to the external devices.

Additionally, when the ECC used in the sub-sector only detects errors like CRC and corrects the errors in an entire sector including sub-sectors using the ECC such as the BCH code, the sub-sector may designate an erasure position and may apply erasure decoding to the ECC (which is applied to an entire sector).

Previously, although it was described above that the majority decision and erasure decoding may be applied together to the majority decision, the present invention is not limited thereto. For the majority decision, a re-read operation for constituting the flip bit combination may be obtained with a predetermined level. This means that read frequency may be increased. That is, if only the erasure decoding is applied to the flip bit combination, the number of re-reads may be reduced.

Figure 13:
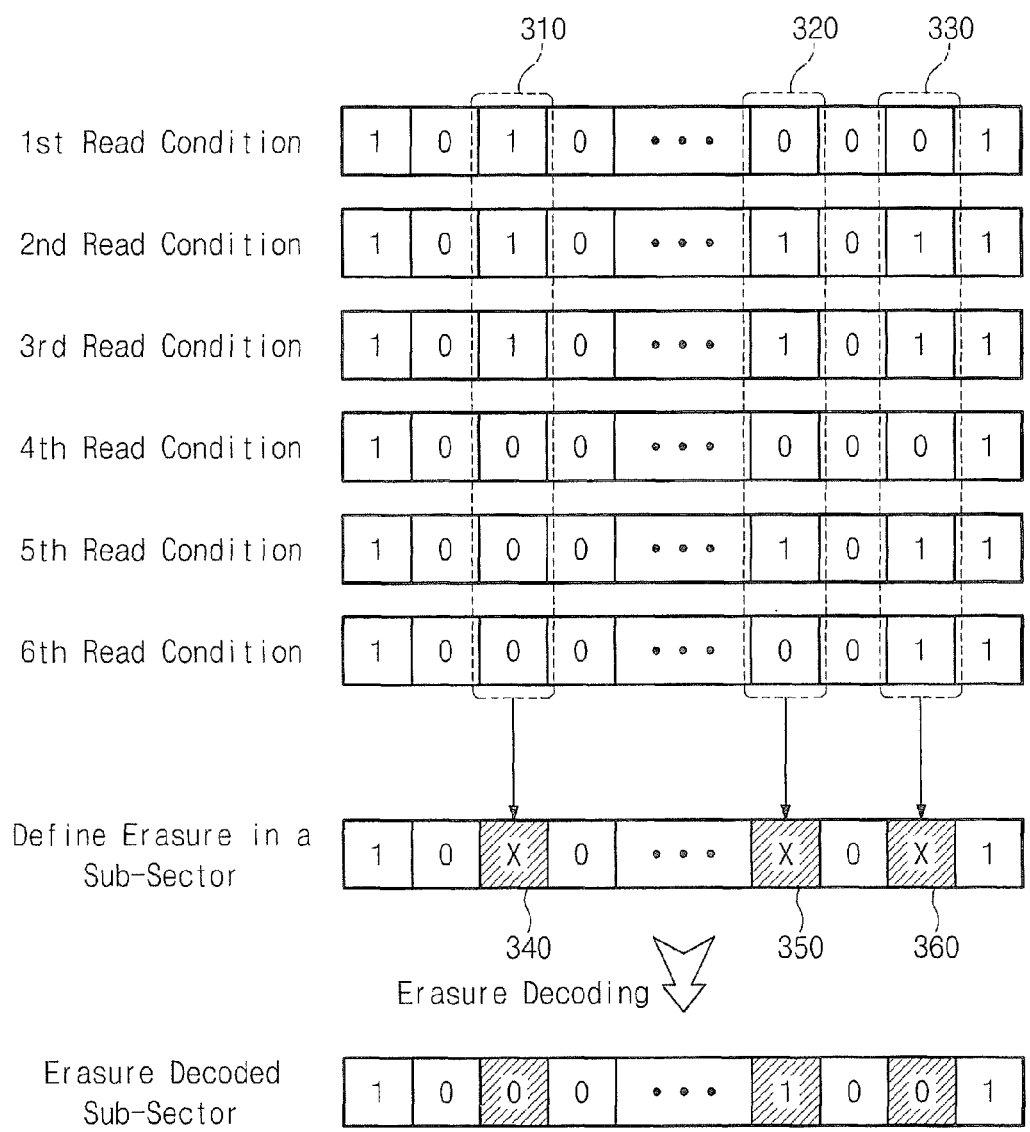
FIG. 13 is a view illustrating an operation for erasure decoding by designating a flip bit combination according to some embodiments of the present invention.

Reference is now made to FIG. 13, which is a view illustrating a flip bit combination of a sub-sector having an error mentioned in FIG. 12. As illustrated and described, the flip bit combination 310 shows the combination where the occurrence number of logic 1 and logic 0 is the same or similar. The flip bit combinations 310 and 320 obtained through the read operations of six times with different read conditions (for example, different read voltages) have the same occurrence frequency of logic 0 and logic 1. Accordingly, the majority decision cannot decide an output value. Additionally, the flip bit combination 330 illustrates a case where the occurrence frequency of logic 1 and logic 0 is similar. That is, logic 0 occurs twice and logic 1 occurs four times in the flip bit combination 330, such that the occurrence of logic 1 is greater. However, if reliability can be achieved with the majority decision, erasure decoding can be applied. The columns 340, 350, and 360 corresponding to the flip bit combinations having the above conditions may be declared as erasure. Logic 0 or logic 1 is substituted into all the columns 340, 350, and 360 corresponding to an erasure of the sub-sector in order to perform an error correction operation. Then, sub-sectors of decoding pass among sub-sector values outputted through the error correction operation may be provided as sub-sectors of the read page.

When an erasure decoding scheme for the above-mentioned flip bit combination is applied, the number of read operations, which are performed repeatedly by changing read conditions, may be reduced. In some embodiments, an appropriate trade-off between the number of read operations and the number of decoding (used for erasure decoding) may be considered.

Figure 14:
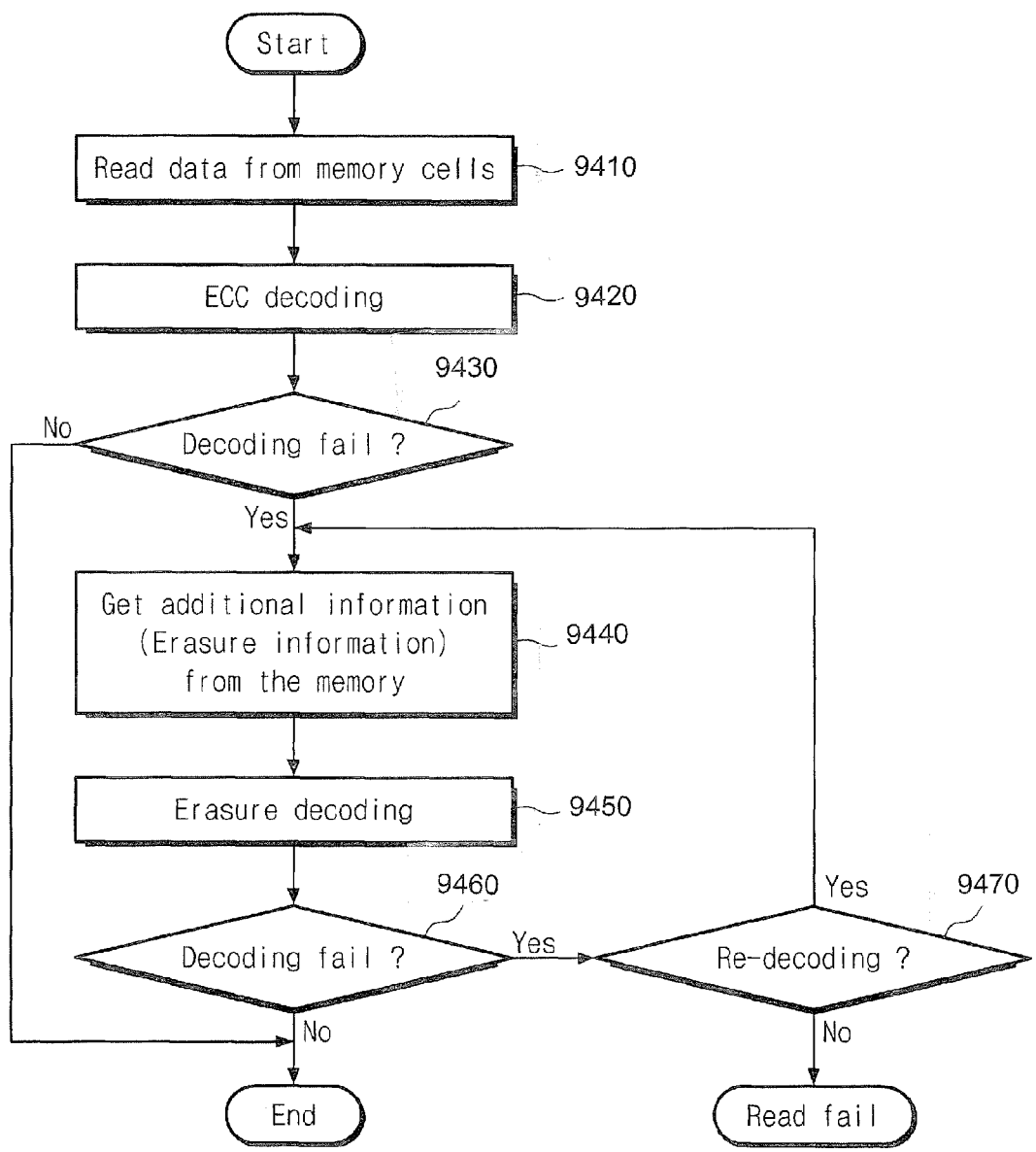
FIG. 14 is a flowchart illustrating a data processing method according to some embodiments of the present invention.

Reference is now made to FIG. 14, which is a flowchart illustrating some embodiments of error correction methods for data reading from a flash memory. Referring to FIG. 14, methods of selectively performing erasure decoding are illustrated briefly. Stored data are read from the flash memory 10 (block 9410). Some embodiments provide that the read data R(x) are delivered to the ECC & erasure decoder 20. The ECC & erasure decoder 20 performs an error correction operation for error detection and correction about the read data R(x) (block 9420). Based on the error correction operation result, if the correctable error exits in the read data R(x) and is corrected, a general reading operation is finished. On the contrary, if there is an error that cannot be corrected through the error correction operation (that is, decoding failure occurs), erasure decoding is performed (block 9450). Prior to erasure decoding, erasure information may be obtained from the flash memory 10 (block 9440). Some embodiments of operations for obtaining erasure information may include the above-mentioned interval read of FIG. 11B and/or the flip bit combination provided through a plurality of read operations of FIG. 12. Additionally, the erasure information can be obtained with reference to various factors such as charge loss, read disturb, program disturb, couplings of a flash memory cell. After obtaining the erasure information, erasure decoding is performed in operation 9450. Some of the realized embodiments of the erasure decoding are described in detail with reference to FIGS. 4, 9, and 10, and thus their detailed description will be omitted corresponding to operation 9450. Based on the erase decoding result, if decoding pass is determined (block 9460), the decoded data are provided as an output and a general read operation will be completed. However, if an error cannot be correctable through the erasure decoding, a re-decoding operation may be performed (block 9470). Once re-decoding is determined, by obtaining erasure information again and using the newly obtained erasure information, erasure decoding will be performed again. Accordingly, it returns to operation 9440 for obtaining erasure information from the flash memory 10. However, once re-decoding is not performed according to the determination, the ECC & erasure decoder 20 declares read fail and transmits a status to a host in operation 9470.

According to the read methods based on the above-mentioned embodiments, erasure decoding may be configured to be selectively performed when decoding fail of an error correction operation occurs.

Figure 15:
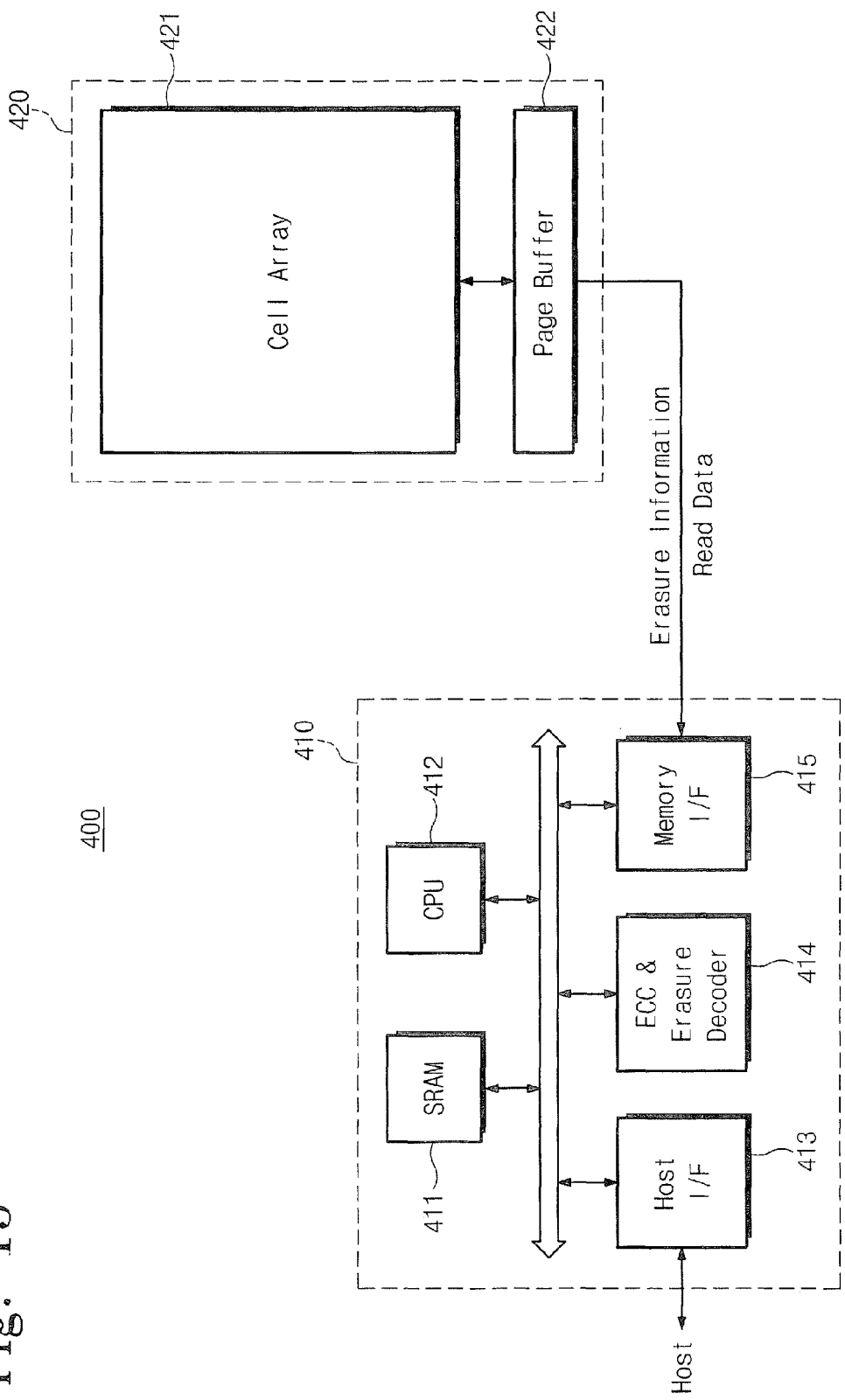
FIG. 15 is a block diagram illustrating a memory system according to some embodiments of the present invention.

FIG. 15 is a block diagram illustrating a memory system 400 including an ECC & erasure decoder 414 according to some embodiments of the present invention. The memory system 400 may include a memory card or a solid state disk (SSD). The memory system 400 may include a high capacity of data storage ability and may include a memory controller 410 having the ECC & erasure decoder 414 of the present invention and a non-volatile memory device 420. The read data from the non-volatile memory device 420 may undergo an error correction operation and/or erasure decoding in the ECC & erasure decoder 414 and may then be provided to a host. For the erasure decoding, the non-volatile memory device 420 may additionally provide erasure information at the request of the memory controller 410.

In some embodiments, SRAM 411 is used as an operation memory of a central processing unit (CPU) 412. A host interface (I/F) 413 includes a data exchange protocol of a host connected to the memory system 400. Some embodiments provide that the ECC & erasure decoder 414 detects and corrects an error included in the read data from the non-volatile memory device 420. The ECC & erasure decoder 414 may have substantially the same functions as the ECC & erasure decoder 20 as discussed above regarding FIG. 1. The memory I/F 415 may interface with the non-volatile memory device 420 according to some embodiments of the present invention. The CPU 412 performs general control operations for data exchange of the memory controller 410. Although not illustrated herein, the memory system 400 may further provide ROM (not shown) for storing code data to interface with a host.

In some embodiments, the non-volatile memory device 420 may include a flash memory device, a phase change random access memory (PRAM) and/or a resistive memory such as a resistance random access memory (PRAM), among others. Some embodiments provide that the non-volatile memory device 420 may be configured to include a memory device using one of memory devices such as a nano floating gate memory (MFGM), a polymer random access memory (PoRAM), a magnetic random access memory (MRAM), and/or a ferroelectric random access memory (FRAM), among others. Some embodiments provide that the non-volatile memory device 420 may be realized in a single chip where one chip is included in one package and/or in a multi chip package (MCP) where a plurality of non-volatile memory devices are mounted in one package.

The memory system 400 may include a semiconductor disk device. The semiconductor disk device may be SSD that can provide highly reliable data. Although not illustrated in the drawing, the memory system 400 can be provided as a storage device of information processing device in order to exchange data of a high capacity by combining with an application chipset, a camera image processor (CIS), and/or a mobile DRAM, among others. In some embodiments, the memory system 400 may include a multimedia (MMC) card, a secure digital (SD) card, a micro SD card, a memory stick, an ID card, a PCMCIA card, a chip card, a USB card, a smart card, and/or a compact flash (CF) card, among others.

Figure 16:
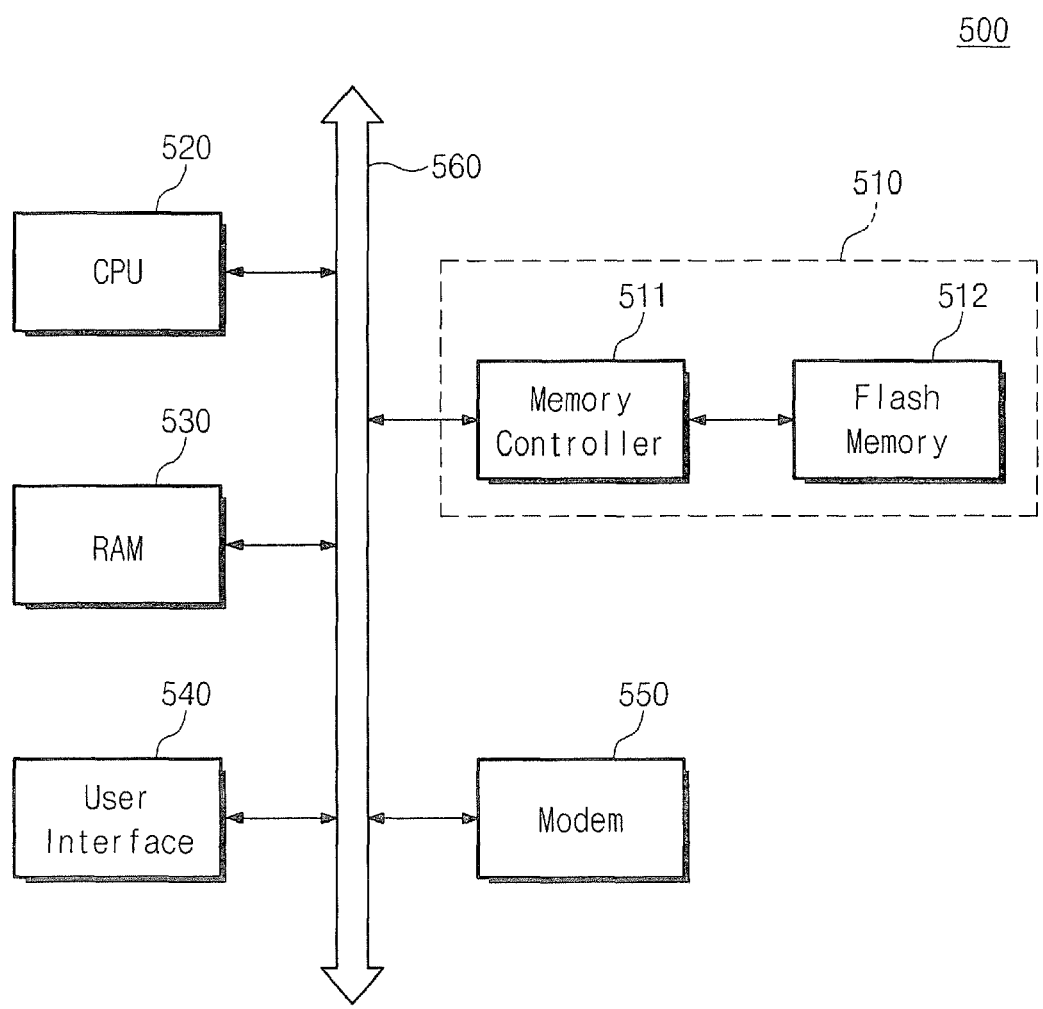
FIG. 16 is a block diagram illustrating a computing system according to some embodiments of the present invention.

Reference is now made to FIG. 16, which is a block diagram illustrating a computing system 500 mounting a memory system according to some embodiments of the present invention. The memory system 510 is mounted in an information processing system such as a mobile device and/or a desktop computer, among others. The computing system 500 may include the memory system 510 (including a memory controller 511 and a flash memory 512), a CPU 520, RAM 530, a user interface 540, and a modem 550, which are electrically connected through a bus 560. The memory system 510 may be configured to be substantially similar to the above-mentioned memory card and/or memory system. The flash memory 512 stores data, which are provided through the user interface 540 or are processed through the CPU 520 through the memory controller 511. Here, the CPU 520 and other components that correspond to a host for mounting the memory system 410 may receive highly reliable data from the memory system 510. The computing system 500 is mounted in a desktop computer and a mobile device such as a mobile phone and a notebook computer, such that it can be used as a data storage unit.

Although not illustrated, the computing system 500 may further include an application chipset, and/or a CIS, among others.

Several embodiments are disclosed with reference to the above drawings and descriptions. Although specific terms are used here, they are used for the purpose of describing the present invention but are not used for limiting meanings or the scopes of the present invention listed in the claims. Therefore, those skilled in the art should understand that various modifications and equivalent other embodiments are possible through the above embodiments. Accordingly, true technical scopes of the present invention should be defined by technical scopes of the accompanying claims.

The flash memory and/or the memory controller according to the present invention may be mounted through various kinds of packages. For example, the flash memory and/or the memory controller may be mounted through various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and/or Wafer-Level Processed Stack Package (WSP), among others.

According to the present invention, the reliability of read data can be drastically improved by improving error correction ability.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data processing method for a non-volatile memory, the method comprising:

obtaining read data and erasure information from the non-volatile memory; and correcting an error in the read data by referencing the erasure information that is obtained from the non-volatile memory, wherein the erasure information corresponds to error for which the position can be found, wherein the erasure information includes data corresponding to a declared erasure position in the read data,
wherein correcting the error comprises:
generating first decoding data by substituting logic 0 into all erased coordinates of the read data and then performing an error correction operation; and
generating second decoding data by substituting logic 1 into all erased coordinates of the read data and then performing an error correction operation.

2. The method according to claim 1, further comprising selecting one of the first decoding data and the second decoding data as final decoding data.

3. The method according to claim 2, wherein selecting one of the first decoding data and the second decoding data comprises selecting the one of the first decoding data and the second decoding data having a shorter hamming distance with respect to the read data as the final decoding data.

4. The method according to claim 1, further comprising:
generating a plurality of parameter data by substituting combination of logic 0 and logic 1 into each of the erased coordinates of the read data; and
generating a plurality of decoding data by performing an error correction operation on each of the plurality of parameter data.

5. The method according to claim 4, further comprising selecting one of the first decoding data, the second decoding data, and the plurality of decoding data as final decoding data.

6. The method according to claim 5, wherein selecting one of the first decoding data, the second decoding data, and the plurality of decoding data as final decoding data comprises selecting the one of the first decoding data, the second decoding data, and the plurality of decoding data having the shortest hamming distance with respect to the read data as the final decoding data.

7. The method according to claim 1, wherein correcting the error comprises:
generating and calculating an erasure locator polynomial $\Gamma(x)$ from the erasure information and the read data;
generating and calculating a syndrome polynomial $S(x)$ by substituting 0 into all the erased coordinates of the read data with reference to a solution of the erasure locator polynomial $\Gamma(x)$;
calculating a modified syndrome polynomial $\Xi(x)$ using the erasure locator polynomial $\Gamma(x)$ and the syndrome polynomial $S(x)$;
generating an error locator polynomial $\Lambda(x)$ from the modified syndrome polynomial $\Xi(x)$ and calculating a solution of the error locator polynomial $\Lambda(x)$; and
generating an error/erasure locator polynomial $\Psi(x)$ by multiplying the error locator polynomial $\Lambda(x)$ by the erasure locator polynomial $\Gamma(x)$ in order to calculate an error value and an erasure value.

8. The method according to claim 7, wherein, generating the error locator polynomial $\Lambda(x)$ comprises applying a Chien search algorithm to obtain a solution of the error locator polynomial $\Lambda(x)$.

9. A data processing method for a non-volatile memory, the method comprising:
obtaining read data and erasure information from the non-volatile memory; and
correcting an error in the read data by referencing the erasure information that is obtained from the non-volatile memory,
wherein the erasure information corresponds to error for which the position can be found,
wherein obtaining the erasure information comprises:
reading repeatedly a selected memory region of the non-volatile memory under respectively different read conditions; and
storing a position as the erasure information, the position having respectively different bit values at the same position among the repeatedly read data.

10. The method according to claim 9, further comprising designating the erasure information as a position where read bits have the same frequency at the same position.

11. A data processing method for a non-volatile memory, the method comprising:
obtaining read data and erasure information from the non-volatile memory; and
correcting an error in the read data by referencing the erasure information that is obtained from the non-volatile memory,
wherein the erasure information corresponds to error for which the position can be found,
wherein obtaining the erasure information comprises:
reading repeatedly between respectively different program states of the non-volatile memory through respectively different read voltages; and
designating a column address of memory cells that have a threshold voltage between the respectively different read voltages as the erasure information.

12. A memory system comprising:
a non-volatile memory; and
a memory controller that is operable to perform an error correction operation,
wherein the memory controller controls the non-volatile memory according to the data processing method of claim 1.

13. A data processing method for a non-volatile memory, the method comprising:
identifying an erasure location as a location of a multibit error in read data from the non-volatile memory;
performing an erasure decoding operation on the erasure location in the non-volatile memory to determine erasure corrected data that is within an error correction operation capacity; and
performing an error correction operation on the erasure corrected data,
wherein erasure location comprises erasure information that corresponds to error for which the position can be found,
wherein performing an erasure decoding operation on the erasure location in the non-volatile memory to determine erasure corrected data that is within an error correction operation capacity comprises:
generating first decoding data by substituting logic 0 into all erased coordinates of the read data and then performing an error correction operation; and
generating second decoding data by substituting logic 1 into all erased coordinates of the read data and then performing an error correction operation.

14. The method according to claim 13, further comprising selecting one of the first decoding data and the second decoding data as final decoding data as the one of the first decoding data and the second decoding data having a shorter hamming distance with respect to the read data as the final decoding data.

* * * * *